United States Patent
Namkung et al.

(10) Patent No.: US 9,029,886 B2
(45) Date of Patent: May 12, 2015

(54) ORGANIC LIGHT EMITTING DIODE DISPLAY

(71) Applicant: Samsung Display Co., Ltd., Yongin, Gyeonggi-Do (KR)

(72) Inventors: Jun Namkung, Yongin (KR); Soon Ryong Park, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 0 days.

(21) Appl. No.: 14/091,481

(22) Filed: Nov. 27, 2013

(65) Prior Publication Data

US 2015/0001483 A1 Jan. 1, 2015

(30) Foreign Application Priority Data

Jun. 27, 2013 (KR) .................... 10-2013-0074681

(51) Int. Cl.
*H01L 33/00* (2010.01)
*H01L 27/32* (2006.01)
*H01L 51/52* (2006.01)

(52) U.S. Cl.
CPC ........ *H01L 27/3244* (2013.01); *H01L 51/5237* (2013.01)

(58) Field of Classification Search
CPC .............. H01L 51/524; H01L 51/5253; H01L 27/1262; H01L 2251/5338
USPC .......................... 257/95; 438/28; 349/60, 160
See application file for complete search history.

(56) References Cited

U.S. PATENT DOCUMENTS

| | | | |
|---|---|---|---|
| 8,229,522 B2 | 7/2012 | Kim et al. | |
| 2003/0027369 A1* | 2/2003 | Yamazaki | ........................ 438/21 |
| 2010/0101649 A1* | 4/2010 | Huignard et al. | ............. 136/261 |
| 2011/0286157 A1* | 11/2011 | Ma | .......................... 361/679.01 |
| 2014/0183473 A1* | 7/2014 | Lee et al. | .......................... 257/40 |
| 2014/0217373 A1* | 8/2014 | Youn et al. | ...................... 257/40 |
| 2014/0346474 A1* | 11/2014 | Jeong et al. | ..................... 257/40 |
| 2014/0354143 A1* | 12/2014 | Jung et al. | ..................... 313/511 |

FOREIGN PATENT DOCUMENTS

KR 1020090073361 7/2009
KR 1020120106453 9/2012

* cited by examiner

*Primary Examiner* — Caridad Everhart
(74) *Attorney, Agent, or Firm* — F. Chau & Associates, LLC

(57) ABSTRACT

An organic light emitting diode (OLED) display includes: a display layer including a front display layer configured to display an image at a front of the OLED display and a bending display layer bent at an end of the front display layer, and a thin film encapsulation layer covering the display layer. The thin film encapsulation layer includes a front encapsulation layer disposed on the front display layer and a bending encapsulation layer disposed on the bending display layer and having a plurality of pores.

20 Claims, 7 Drawing Sheets

ORGANIC LIGHT EMITTING DIODE DISPLAY

RELATED APPLICATIONS

This application claims priority to Korean Patent Application No. 10-2013-0074681 filed on Jun. 27, 2013, the disclosure of which is hereby incorporated by reference herein in its entirety.

1. TECHNICAL FIELD

The present disclosure relates generally to an organic light emitting diode (OLED) display.

2. DISCUSSION OF THE RELATED ART

An organic light emitting diode (OLED) display may include, for example, a plurality of organic light emitting diodes (OLED) formed of a hole injection electrode, an organic emission layer, and an electron injection electrode. Each OLED emits light by energy generated when excitons generated as electrons and holes are combined drop from an excited state to a ground state, and the OLED display displays an image by using the light.

The organic light emitting diode (OLED) may be degraded by external factors such as, for example, external moisture and oxygen or ultraviolet (UV) rays such that packaging encapsulating the organic light emitting diode (OLED) may be necessary and thus the organic light emitting diode (OLED) display may be required to be thin or to be easily bent. To bend the organic light emitting diode (OLED) display with the thin thickness while encapsulating the organic light emitting diode (OLED), a thin film encapsulation (TFE) technique has been developed. The thin film encapsulation (TFE) technique is a technique of covering the display area with the thin film encapsulation layer by alternately depositing at least one organic layer and at least one inorganic layer on the organic light emitting diodes (OLED) formed at the display area of the display substrate.

As one of flexible organic light emitting diode (OLED) displays that can be bent, a bendable organic light emitting diode (OLED) display has a structure, for example, in which a display part without a dead space may be realized and simultaneously the bending display part is visible at a side by bending an edge of a front display part.

However, the bendable organic light emitting diode (OLED) display is manufactured with reference to the front display part such that maximum luminance may be obtained at, for example, a viewing angle of about 0 degrees at the front side, but the luminance may be sharply deteriorated at the bending display part.

SUMMARY

Exemplary embodiments of the present invention provide an organic light emitting diode (OLED) display including a bending display part with increased luminance.

An organic light emitting diode (OLED) display according to an exemplary embodiment includes: a display layer including a front display layer configured to display an image at a front of the OLED display and a bending display layer bent at an end of the front display layer, and a thin film encapsulation layer covering the display layer. The thin film encapsulation layer includes a front encapsulation layer disposed on the front display layer and a bending encapsulation layer disposed on the bending display layer and having a plurality of pores.

A size of the pores disposed in the bending encapsulation layer may be in a range from about 10 Å to about 10,000 Å.

The size of the pores may gradually decrease as a bending angle of the bending encapsulation layer increases.

The thin film encapsulation layer may include a plurality of deposited inorganic layers and organic layers.

The inorganic layer may be one selected from AlOx, TiOx, ZnO, SiOx, and SiNx.

The pores may be disposed in at least one among the plurality of inorganic layers and organic layers.

In accordance with an exemplary embodiment, an organic light emitting diode (OLED) display is provided. The OLED display includes a display layer including a front display layer disposed at a front display part of the OLED display and configured to display an image at the front part of the OLED display and a bending display layer disposed at a bending display part of the OLED display and bent at an end of the front display layer.

The front display layer and the bending display layer of the display layer each include a substrate, a thin film display layer including a plurality of thin film transistors (TFT's) and a storage capacitor and disposed on the substrate, and an organic light emitting diode disposed on the thin film display layer.

In addition, the OLED display further includes a thin film encapsulation layer disposed on the organic light emitting diode of the display layer. The thin film encapsulation layer includes a front encapsulation layer disposed on the front display layer and a bending encapsulation layer disposed on the bending display layer and having a plurality of pores. The front encapsulation layer and the bending encapsulation layer each include a plurality of inorganic layers and a plurality of organic layers.

In accordance with an exemplary embodiment, an organic light emitting diode (OLED) display is provided. The OLED display includes a display layer including a front display layer disposed at a front display part of the OLED display and configured to display an image at the front display part of the OLED display and a bending display layer disposed at a bending display part of the OLED display and bent at an end of the front display layer.

The front display layer and the bending display layer of the display layer each include a substrate, a buffer layer disposed on the substrate, a gate insulating film disposed on the buffer layer, an interlayer insulating film disposed on the gate insulating film, a thin film switching transistor disposed on the buffer layer, the gate insulating film and the interlayer insulating film, a thin film driving transistor disposed on the buffer layer, the gate insulating film and the interlayer insulating film, in which the thin film driving transistor and the thin film switching transistor are spaced apart from each other, a storage capacitor disposed on the interlayer insulating film and the gate insulating film, a protective film disposed on the thin film switching transistor, the thin film driving transistor and the storage capacitor, a pixel electrode disposed on the protective film of the display layer,
a pixel defining layer disposed on portions of the pixel electrode and the protective film and including an opening exposing the pixel electrode, an organic emission layer disposed in the opening of the pixel defining layer, and
a common electrode disposed on the pixel defining layer and the organic emission layer. The pixel electrode, the organic emission layer and the common electrode constitute an organic light emitting diode.

In addition, the OLED display further includes a thin film encapsulation layer disposed on the organic light emitting diode of the display layer. The thin film encapsulation layer includes a front encapsulation layer disposed on the front display layer and a bending encapsulation layer disposed on the bending display layer and having a plurality of pores. The front encapsulation layer and the bending encapsulation layer each include a plurality of inorganic layers and a plurality of organic layers.

According to an exemplary embodiment, by only forming a plurality of pores in the bending display layer positioned at the bending display part among the thin film encapsulation layer, the light is refracted by the pores such that the luminance of the bending display part may be increased, and thus as a result the bending display part may be recognized relatively easily by a user.

BRIEF DESCRIPTION OF THE DRAWINGS

Exemplary embodiments of the present invention can be understood in more detail from the following detailed description taken in conjunction with the attached drawings, in which.

DETAILED DESCRIPTION OF EXEMPLARY EMBODIMENTS

Figure 1:
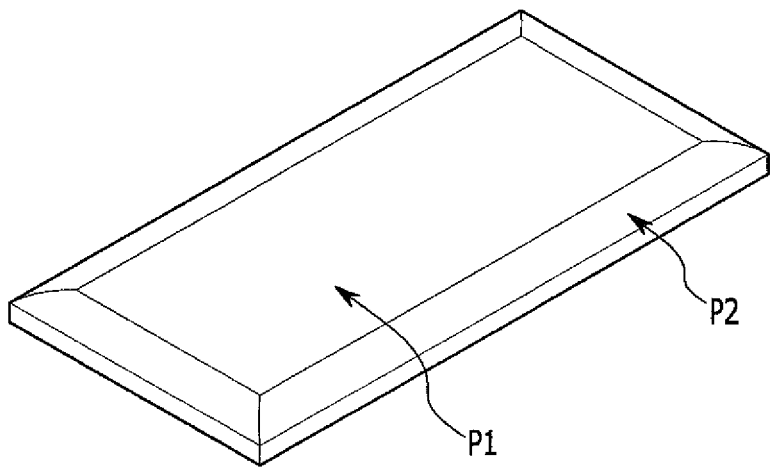
FIG. 1 is a perspective view of an organic light emitting diode (OLED) display according to an exemplary embodiment.

Exemplary embodiments of the present invention will be described more fully hereinafter with reference to the accompanying drawings, in which exemplary embodiments of the invention are shown. As those skilled in the art would realize, exemplary embodiments of the present invention may be modified in various different ways, all without departing from the spirit or scope of the present invention.

Parts not related to the description are omitted for clear description of exemplary embodiments of the present invention, and like reference numerals designate like elements and similar constituent elements throughout the specification.

As used herein, the singular forms, "a", "an", and "the" are intended to include plural forms as well, unless the context clearly indicates otherwise.

Further, sizes and thicknesses of constituent members shown in the accompanying drawings may be arbitrarily given for better understanding and ease of description, but exemplary embodiments of the present invention are not limited to the illustrated sizes and thicknesses.

In the drawings, the thickness of layers, films, panels, regions, etc., may be exaggerated for clarity. In the drawings, for better understanding and ease of description, the thicknesses of some layers and areas may be exaggerated. It will be understood that when an element such as a layer, film, region, or substrate is referred to as being "on" another element, it can be directly on the other element or intervening elements may also be present.

In addition, in the accompanying drawings, a 2Tr 1Cap structured active matrix (AM) type of organic light emitting diode (OLED) display in which a pixel includes two thin film transistors (TFT) and one capacitor is illustrated. However, exemplary embodiments of the present invention are not limited thereto. Therefore, an OLED display may have various structures in which a pixel may include a plurality of TFTs and at least one capacitor, a wiring line may be further formed, and a conventional wiring line may be omitted. Here, a pixel refers to a minimum unit that displays an image, and an OLED display displays an image through a plurality of pixels.

An OLED display according to an exemplary embodiment will now be described in detail with reference to FIG. 1 to FIG. 6.

Figure 2:
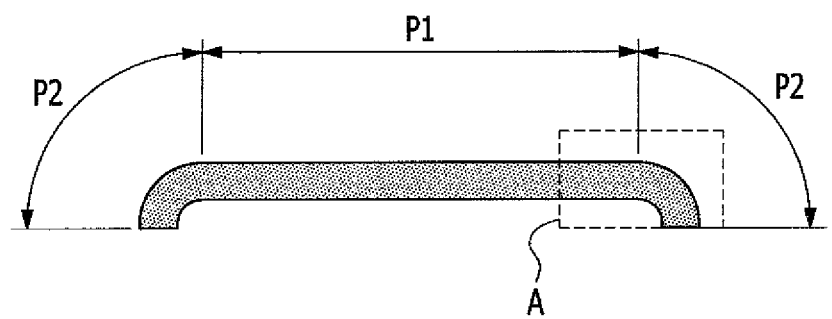
FIG. 2 is a side view of an organic light emitting diode (OLED) display according to an exemplary embodiment.
Figure 3:
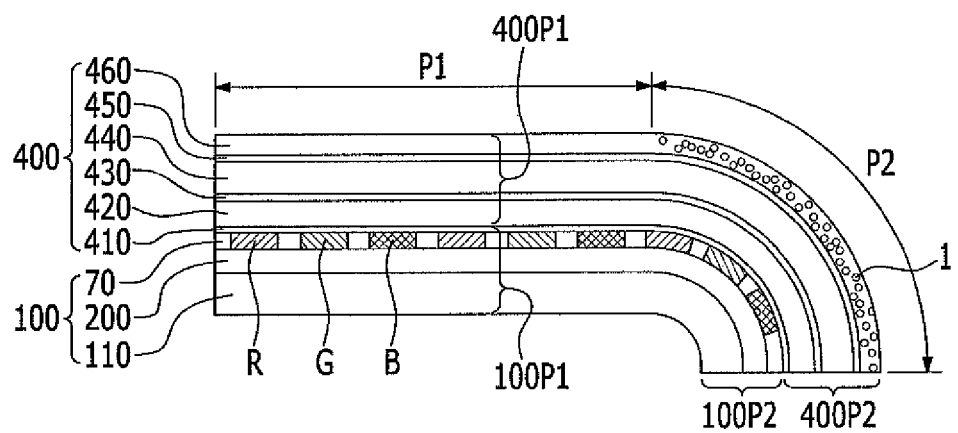
FIG. 3 is an enlarged cross-sectional view of a portion A of FIG. 2.

FIG. 1 is a perspective view of an organic light emitting diode (OLED) display according to the present exemplary embodiment, FIG. 2 is a side view of an organic light emitting diode (OLED) display according to the present exemplary embodiment, and FIG. 3 is an enlarged cross-sectional view of a portion A of FIG. 2.

As shown in FIG. 1 and FIG. 2, an organic light emitting diode (OLED) display according to the present exemplary embodiment includes, for example, a front display part P1 realizing an image at a front side, and a bending display part P2 bent from an end of the front display part P1 and realizing the image at a side. As described above, the organic light emitting diode (OLED) display according to the present exemplary embodiment is formed of the front display part P1 and the bending display part P2 such that a dead space where the image is not realized is removed, thereby maximizing a display part realizing the image.

Next, the portion A including the bending display part P2 of the organic light emitting diode (OLED) display according to the present exemplary embodiment will be described with reference to FIG. 3.

As shown in FIG. 3, the organic light emitting diode (OLED) display according to the present exemplary embodiment includes, for example, a display layer 100 displaying the image and a thin film encapsulation layer 400 covering the display layer 100.

The display layer 100 includes, for example, a front display layer 100P1 positioned at the front display part P1 and a bending display layer 100P2 positioned at the bending display part P2, and the thin film encapsulation layer 400 includes, for example, a front encapsulation layer 400P1 positioned at the front display part P1 and a bending encapsulation layer 400P2 positioned at the bending display part P2.

The thin film encapsulation layer 400 includes, for example, a plurality of inorganic layers and organic layers, and the thin film encapsulation layer 400 of the organic light emitting diode (OLED) display according to the present exemplary embodiment shown in FIG. 3 includes, for example, a first inorganic layer 410, a first organic layer 420, a second inorganic layer 430, a second organic layer 440, a third inorganic layer 450, and a fourth inorganic layer 460 that are sequentially deposited. The sequence, the material, etc., of the layers forming the thin film encapsulation layer 400 are not limited thereto, and numerous variations are possible.

The material of the first inorganic layer 410, the second inorganic layer 430, the third inorganic layer 450, and the fourth inorganic layer 460 may be selected from, for example, aluminum oxide (AlOx), titanium oxide (TiOx), zinc oxide (ZnO), silicon oxide (SiOx), and silicon nitride (SiNx).

For example, a plurality of pores 1 may be formed in at least one among the bending encapsulation layer 400P2 of the thin film encapsulation layer 400 of the organic light emitting diode (OLED) display according to the present exemplary embodiment, and as shown in FIG. 3, a plurality of pores 1 are formed in the fourth inorganic layer 460.

After depositing AlOx by a sputtering process to form the fourth inorganic layer 460, the plurality of pores 1 may be formed. For example, a gas may be used for forming the plurality of pores 1, and the gas for forming the pores 1 may be one selected from a compound of sulfuric acid ($H_2SO_4$) and sodium fluoride (NaF) and a compound of carbon dioxide ($CO_2$) and methane ($CH_4$).

The size of the pores 1 may be in a range from, for example, about 10 Å to about 10,000 Å. If the size of the pores is less than about 10 Å, it may be difficult to form the pores in the manufacture process, while if the size of the pores 1 is more than about 10,000 Å, a refraction effect by the pores 1 is not large such that a luminance increase in the bending display part P2 is not expected.

As described above, by forming a plurality of pores 1 in the bending encapsulation layer 400P2 of the thin film encapsulation layer 400, the light is refracted by the pores 1 such that the luminance of the bending display part P2 may be increased, thereby rendering the bending display part P2 to be relatively easily recognizable by a user.

Also, by forming the pores 1 in the bending encapsulation layer 400P2 without the formation of the pores 1 in the front encapsulation layer 400P1 of the thin film encapsulation layer 400, white angular dependency (WAD) may be formed without a reduction of the front efficiency. In contrast, when also forming the pores in the front encapsulation layer, the light is refracted by the pores such that the efficiency of the light emitted through the front encapsulation layer may be deteriorated. However, by only forming the pores 1 in the bending encapsulation layer 400P2, the white angular dependency (WAD) may be formed without the reduction of the efficiency of the light emitted into the front, thereby increasing the WAD.

Meanwhile, a detailed structure of the display layer 100 shown in FIG. 3 will be described with reference to FIG. 4 to FIG. 6.

Figure 4:
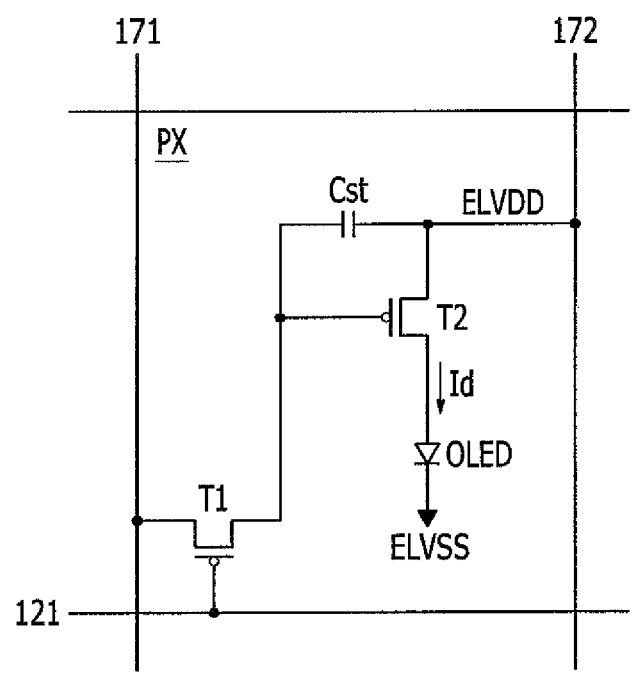
FIG. 4 is an equivalent circuit of one pixel of an organic light emitting diode (OLED) display according to an exemplary embodiment.

FIG. 4 is an equivalent circuit of one pixel of an organic light emitting diode (OLED) display according to an exemplary embodiment.

As shown in FIG. 4, the pixel of the organic light emitting diode (OLED) display according to the present exemplary embodiment includes, for example, a plurality of signal lines 121, 171, and 172, and a plurality of pixels PX connected to the signal lines 121, 171, and 172 and arranged in a matrix form.

The signal lines include, for example, a plurality of scan lines 121 for transmitting scan signals (or gate signals), a plurality of data lines 171 for transmitting data signals, and a plurality of driving voltage lines 172 for transmitting a driving voltage ELVDD. The scan lines 121 run, for example, parallel with each other in a row direction, and the data lines 171 and the driving voltage lines 172 run, for example, parallel with each other in a column direction. Each of the pixels PX includes, for example, a switching thin film transistor T1, a driving thin film transistor T2, a storage capacitor Cst, and an organic light emitting diode (OLED).

The switching thin film transistor T1 has, for example, a control terminal, an input terminal, and an output terminal. The control terminal is connected to, for example, the scan line 121, the input terminal is connected to the data line 171, and the output terminal is connected to the driving thin film transistor T2. The switching thin film transistor T1 transmits a data signal applied to the data line 171 to the driving thin film transistor T2 in response to a scan signal applied to the scan lines 121.

The driving thin film transistor T2 also has, for example, a control terminal, an input terminal, and an output terminal. The control terminal is connected to the switching thin film transistor T1, the input terminal is connected to the driving voltage line 172, and the output terminal is connected to the organic light emitting diode OLED. The driving thin film transistor T2 causes an output current Id to flow, which varies in amplitude in accordance with a voltage applied between the control terminal and the output terminal.

The storage capacitor Cst is connected between the control terminal and input terminal of the driving thin film transistor T2. The storage capacitor Cst charges a data signal applied to the control terminal of the driving thin film transistor T2, and maintains the data signal after the switching thin film transistor T1 is turned off.

The organic light emitting diode OLED has an anode connected to the output terminal of the driving thin film transistor T2 and a cathode connected to a common voltage ELVSS. The organic light emitting diode OLED displays an image by emitting light with different intensities according to an output current Id of the driving thin film transistor T2.

The switching thin film transistor T1 and the driving thin film transistor T2 may be n-channel field effect transistors (FETs) or p-channel field effect transistors. The connection relationship among the thin film transistors T1 and T2, the storage capacitor Cst, and the organic light emitting diode OLED may vary.

A detailed structure of the pixel of the organic light emitting diode display of FIG. 4 will now be described in further detail with reference to FIG. 5 and FIG. 6 as well as FIG. 4.

Figure 5:
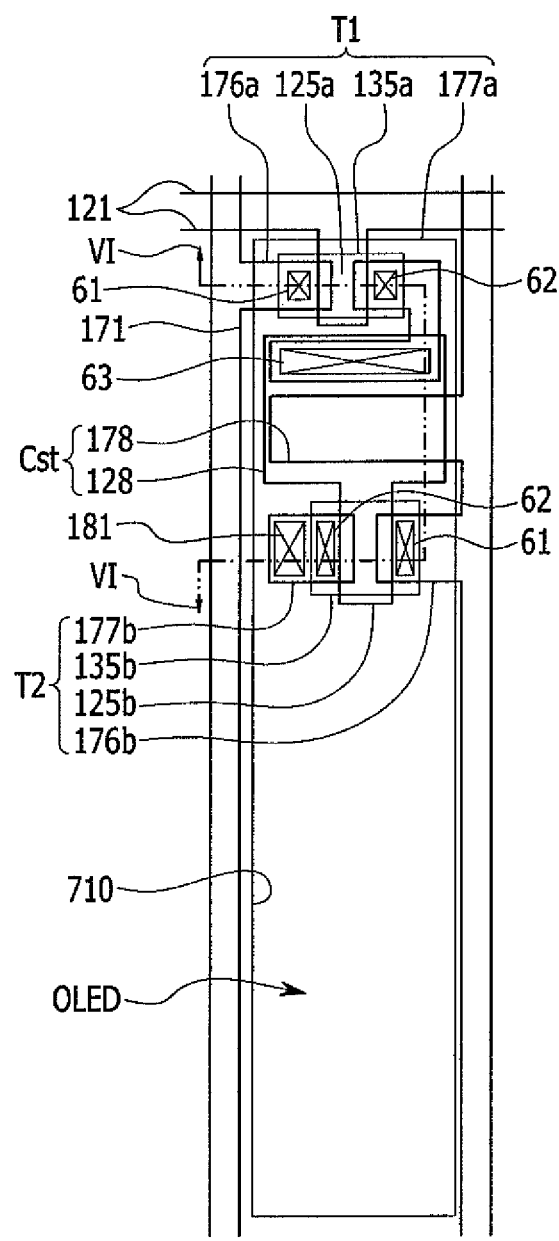
FIG. 5 is a layout view of one pixel of an organic light emitting diode (OLED) display according to an exemplary embodiment.
Figure 6:
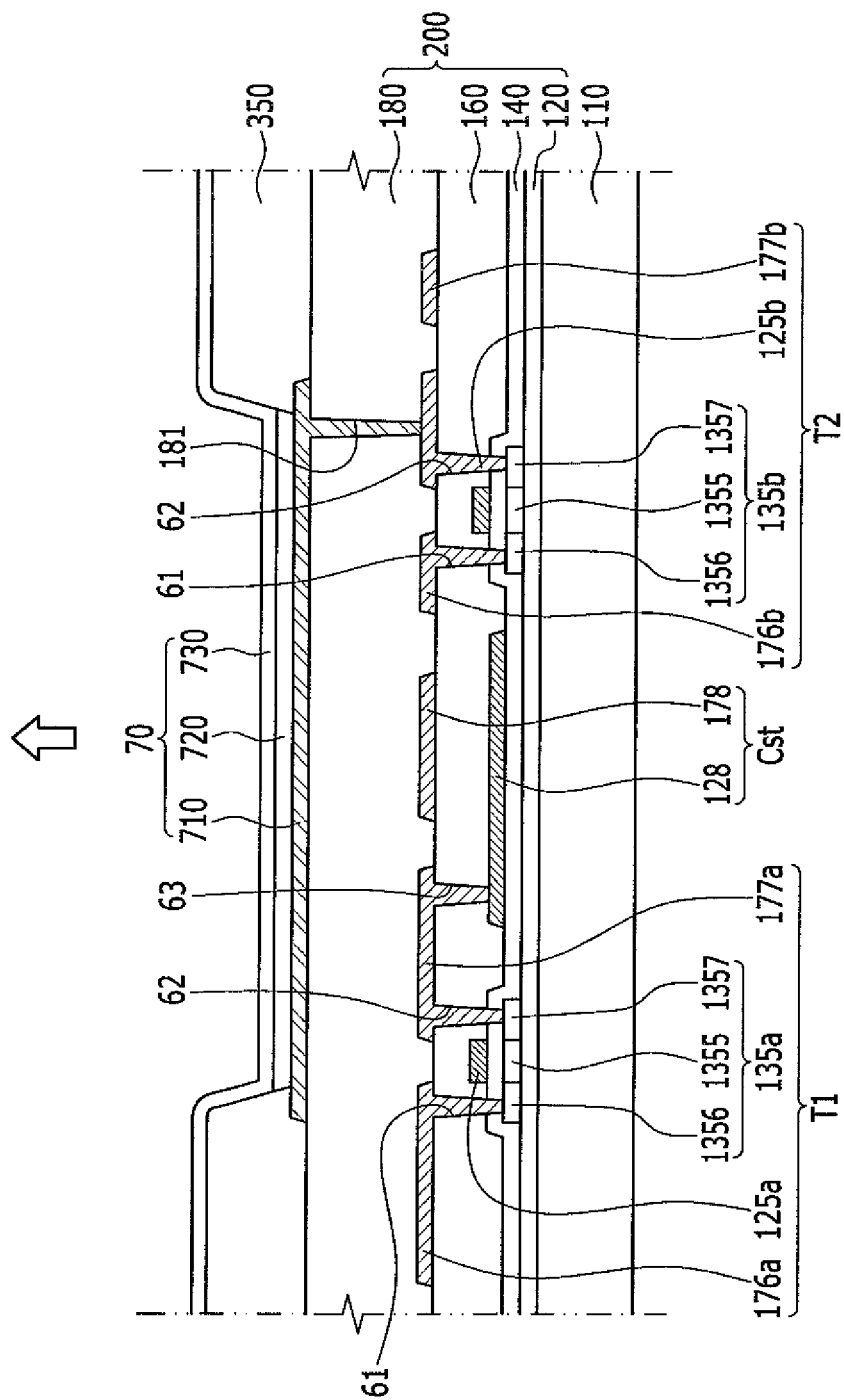
FIG. 6 is a cross-sectional view taken along the line VI-VI of FIG. 5.

FIG. 5 is a layout view of one pixel of an organic light emitting diode (OLED) display according to an exemplary embodiment, and FIG. 6 is a cross-sectional view taken along the line VI-VI of FIG. 5.

As shown in FIG. 5 and FIG. 6, the display layer 100 of the organic light emitting diode (OLED) display according to the present exemplary embodiment includes, for example, a substrate 110, and a thin film display layer 200, and a plurality of organic light emitting diodes (OLED) 70 formed on the substrate 110. The substrate 110 may be, for example, an insulative substrate made of glass, quartz, ceramic, plastic, etc. For example, in an embodiment, the substrate 110 may be a flexible substrate formed of a plastic material, such as polyethyleneterepthalate (PET), polyethyelenennapthalate (PEN), polycarbonate (PC), polyallylate, polyetherimide (PEI), polyethersulphone (PES), polyimide (PI), or the like.

A buffer layer 120 is formed in the thin film display layer 200. The buffer layer 120 may have, for example, a single-layer structure of silicon nitride (SiNx), or a dual-layer structure of silicon nitride (SiNx) and silicon oxide (SiO2) laminated to each other. The buffer layer 120 prevents penetration of unnecessary elements, such as, for example, impurities or moisture, and helps planarize the surface.

A switching semiconductor layer 135a and a driving semiconductor layer 135b are formed on the buffer layer 120, and are spaced apart from each other. These semiconductor layers 135a and 135b may be made of, for example, a polysilicon or oxide semiconductor. The oxide semiconductor may include, for example, one selected from the group consisting of oxides based on titanium (Ti), hafnium (Hf), zirconium (Zr), aluminum (Al), tantalum (Ta), germanium (Ge), zinc (Zn), gallium (Ga), tin (Sn), or indium (In), and complex oxides thereof. For example, in an embodiment, the oxide semiconductor may include at least one of the following such as zinc oxide (ZnO), indium-gallium-zinc oxide (InGaZnO4), indium-zinc oxide (Zn—In—O), zinc-tin oxide (Zn—Sn—O), indium-gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium-gallium oxide (In—Ge—Ga—O), titanium-indium-zinc oxide (Ti—In—Zn—O), and hafnium-indium-zinc oxide (Hf—In—Zn—O). For example, if the semiconductor layers 135a and 135b are made of the oxide semiconductor, a separate protective layer may be added to protect the oxide semiconductor from the outside environment such as from a high temperature.

The semiconductor layers 135a and 135b each include, for example, a channel region not doped with impurities and source and drain regions doped with impurities and formed at respective sides of the channel region. The impurities vary according to the type of thin film transistors, and may be N-type impurities or P-type impurities.

The switching semiconductor layer 135a and the driving semiconductor layer 135b each are divided into, for example, a channel region 1355 and a source region 1356 and drain region 1357 formed at respective sides of the channel region 1355. The channel regions 1355 of the switching semiconductor layer 135a and the driving semiconductor layer 135b may include, for example, polysilicon not doped with impurities, that is, an intrinsic semiconductor, and the source regions 1356 and drain regions 1357 of the switching semiconductor layer 135a and the driving semiconductor layer 135b may include, for example, polysilicon doped with conductive impurities, that is, an impurity semiconductor.

A gate insulating film 140 is formed on the switching semiconductor layer 135a and the driving semiconductor layer 135b. The gate insulating film 140 may be, for example, a single layer or plurality of layers containing at least one of silicon nitride (SiNx), silicon oxide (SiO$_2$), tetraethyl orthosilicate (TEOS), silicon oxynitride (SiON), aluminum oxide (AlOx), yttrium oxide (Y$_2$O$_3$), hafnium oxide (HfOx), zirconium oxide (ZrOx), aluminum nitride (AlN), aluminum oxynitride (AlNO), titanium oxide (TiOx), barium titanate (BaTiO3), and lead titanate (PbTiO$_3$).

A scan line 121, a driving gate electrode 125b, and a first storage capacitor plate 128 are formed on the gate insulating film 140. The scan line 121, for example, longitudinally extends in a horizontal direction and transfers a scan signal, and includes a switching gate electrode 125a protruding from the scan line 121 toward the switching semiconductor layer 135a. The driving gate electrode 125b, for example, protrudes from the first storage capacitor plate 128 toward the driving semiconductor layer 135b. The switching gate electrode 125a and the driving gate electrode 125b, for example, overlap the channel regions 1355, respectively.

An interlayer insulating film 160 is formed on the scan line 121, the driving gate electrode 125b, and the first storage capacitor plate 128. Like the gate insulating film 140, the interlayer insulating film 160 may be formed of, for example, silicon nitride (SiNx), silicon oxide (SiO$_2$), tetraethyl orthosilicate (TEOS), silicon oxynitride (SiON), aluminum oxide (AlOx), yttrium oxide (Y$_2$O$_3$), hafnium oxide (HfOx), zirconium oxide (ZrOx), aluminum nitride (AlN), aluminum oxynitride (AlNO), titanium oxide (TiOx), barium titanate (BaTiO3), and lead titanate (PbTiO$_3$).

Source contact holes 61 and drain contact holes 62 are formed in the interlayer insulating film 160 and the gate insulating film 140 to expose the source regions 1356 and the drain regions 1357, and storage contact holes 63 are formed in the interlayer insulating film 160 to expose part of the first storage capacitor plate 128.

For example, a data line 171 having a switching source electrode 176a, a driving voltage line 172 having a driving source electrode 176b and a second storage capacitor plate 178, and a switching drain electrode 177a and a driving drain electrode 177b that are connected to the first storage capacitor plate 128 are formed on the interlayer insulating film 160.

The data line 171 transfers a data signal, and extends, for example, in a direction crossing the gate line 121. The driving voltage line 172 transfers a driving voltage, and is separated from the data line 171 and extends, for example, in the same direction as the data line 171.

The switching source electrode 176a, for example, protrudes from the data line 171 toward the switching semiconductor layer 135a, and the driving source electrode 176b, for example, protrudes from the driving voltage line 172 toward the driving semiconductor layer 135b. The switching source electrode 176a and the driving source electrode 176b are respectively connected to the source regions 1356 through the source contact holes 61. The switching drain electrode 177a faces the switching source electrode 176a, the driving drain electrode 177b faces the driving source electrode 176b, and the switching drain electrode 177a and the driving drain electrode 177b are respectively connected to the drain regions 1357 through the drain contact holes 62.

The switching drain electrode 177a is extended and electrically connected to the first storage capacitor plate 128 and the driving gate electrode 125b through the storage contact holes 63 formed in the interlayer insulating layer 160.

The switching gate electrode 125a, the driving drain electrode 125b, the switching source electrode 176a, the switching drain electrode 177a, the driving source electrode 176b and the driving drain electrode 177b may each include, for example, silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), molybdenum (Mo), titanium (Ti), tungsten (W), molybdenum tungsten (MoW), and aluminum (Al)/copper (Cu), copper (Cu), zinc (Zn), cobalt (Co), manganese (Mn), iridium (Ir), rhodium (Rh), osmium (Os), tantalum (Ta), or a compound of any of these.

The second storage capacitor plate 178, for example, protrudes from the driving voltage line 171, and overlaps the first storage capacitor plate 128. Accordingly, the first storage capacitor plate 128 and the second storage capacitor plate 178 constitute the storage capacitor Cst by using the interlayer insulating film 160 as a dielectric material.

The switching semiconductor layer 135a, the switching gate electrode 125a, the switching source electrode 176a, and the switching drain electrode 177a constitute the switching thin film transistor T1, and the driving semiconductor layer 135b, the driving gate electrode 125b, the driving source electrode 176b, and the driving drain electrode 177b constitute the driving thin film transistor T2.

A protective film 180 is formed on the switching source electrode 176a, the driving source electrode 176b, the switching drain electrode 177a, and the driving drain electrode 177b.

A pixel electrode 710 is formed on the protective film 180, and the pixel electrode 710 may be made of a transparent conducting material such as, for example, ITO (indium tin oxide), IZO (indium zinc oxide), ZnO (zinc oxide), or In2O3 (indium oxide), or a reflective metal such as, for example, lithium (Li), calcium (Ca), lithium fluoride/calcium (LiF/Ca), lithium fluoride/aluminum (LiF/Al), aluminum (Al), silver (Ag), magnesium (Mg), or gold (Au). The pixel electrode 710 is electrically connected to the driving drain electrode 177b of the driving thin film transistor T2 through a contact hole 181 formed in the interlayer insulating film 160, and serves as an anode of the organic light emitting diode.

A pixel defining layer 350 is formed on edge portions of the pixel electrode 710 and the protective film 180. The pixel defining layer 350 has, for example, an opening 351 exposing the pixel electrode 710. The protective film 180 may be made of, for example, a resin such as polyacrylate resin or polyimide resin, a silica-based inorganic material, or the like.

An organic emission layer 720 is formed in the opening 351 of the pixel defining layer 350. The organic emission layer 720 is formed as, for example, a plurality of layers including one or more of an emission layer, a hole-injection layer HIL, a hole-transporting layer HTL, an electron-transporting layer ETL, and an electron-injection layer EIL. For example, if the organic emission layer 720 includes all of them, the hole-injection layer may be positioned on the pixel electrode 710 serving as an anode, and the hole-transporting layer, the emission layer, the electron-transporting layer, and the electron-injection layer may be sequentially laminated on the pixel electrode 710.

The organic emission layer 720 may include, for example, a red organic emission layer for emitting red light, a green organic emission layer for emitting green light, and a blue organic emission layer for emitting blue light, and the red organic emission layer, the green organic emission layer, and the blue organic emission layer are respectively formed in red, green, and blue pixels, thereby displaying a color image.

Moreover, the red organic emission layer, green organic emission layer, and blue organic emission layer of the organic emission layer 720 may be, for example, respectively laminated on the red pixel, green pixel, and blue pixel, and a red color filter, a green color filter, and a blue color filter may be formed for the respective pixels, thereby displaying a color image. Alternatively, for example, in an embodiment, a white organic emission layer for emitting white light may be formed on all of the red, green, and blue pixels, and a red color filter, a green color filter, and a blue color filter may be formed for the respective pixels, thereby displaying a color image. If the white organic emission layer and the color filters are used to display a color image, there is no need to use a deposition mask for depositing the red, green, and blue organic emission layers on the respective pixels, e.g., the red, green, and blue pixels.

The white organic emission layer described in this example may be formed as, for example, one organic emission layer or a plurality of organic emission layers that are laminated to emit white light. For example, at least one yellow organic emission layer and at least one blue organic emission layer may be combined to emit white light, at least one cyan organic emission layer and at least one red organic emission layer may be combined to emit white light, or at least one magenta organic emission layer and at least one green organic emission layer may be combined to emit white light.

A common electrode 730 is formed on the pixel defining layer 350 and the organic emission layer 720. The common electrode 730 may be made of a transparent conducting material such as, for example, ITO (indium tin oxide), IZO (indium zinc oxide), ZnO (zinc oxide), or In2O3 (indium oxide), or a reflective metal such as, for example, lithium (Li), calcium (Ca), lithium fluoride/calcium (LiF/Ca), lithium fluoride/aluminum (LiF/Al), aluminum (Al), silver (Ag), magnesium (Mg), or gold (Au). The common electrode 730 serves as a cathode of the organic light emitting diode OLED. The pixel electrode 710, the organic emission layer 720, and the common electrode 730 constitute the organic light emitting diode (OLED) 70.

Meanwhile, the thin film encapsulation layer 400 of FIG. 3 in which the size of the plurality of pores 1 formed in the bending encapsulation layer 400P2 is, for example, uniform is applied to the organic light emitting diode (OLED) display of the present exemplary embodiment illustrated in FIG. 6 but exemplary embodiments of the present invention are not limited thereto. For example, alternatively, in an embodiment, the size of the plurality of pores may be, for example, reduced as a bending angle of the bending encapsulation layer is increased.

Next, referring to FIG. 7, an organic light emitting diode (OLED) display according to an exemplary embodiment will be described.

Figure 7:
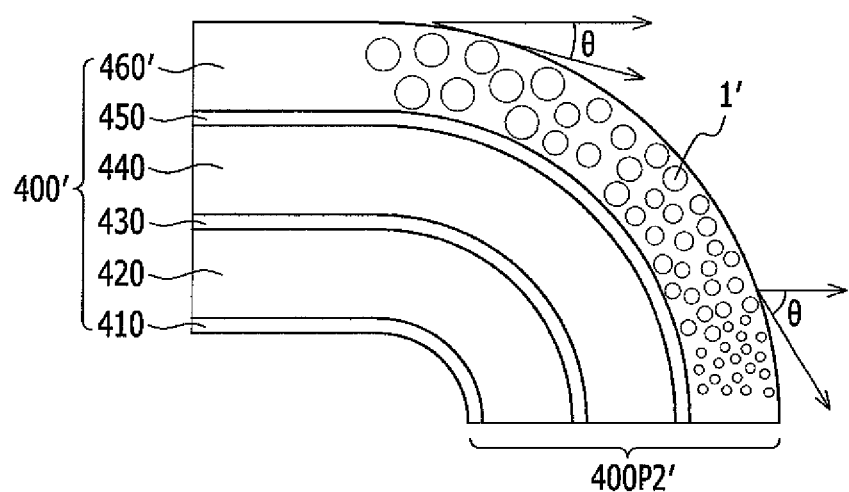
FIG. 7 is an enlarged cross-sectional view of a bending encapsulation layer of an organic light emitting diode (OLED) display according to an exemplary embodiment.

FIG. 7 is an enlarged cross-sectional view of a bending encapsulation layer according to an organic light emitting diode (OLED) display according to an exemplary embodiment.

The present exemplary embodiment is substantially equivalent to the organic light emitting diode (OLED) display shown in FIG. 1 to FIG. 6, except for a change of the size of the plurality of pores formed in the bending encapsulation layer such that an overlapping description is omitted.

For example, as shown in FIG. 7, for the thin film encapsulation layer 400' of the organic light emitting diode (OLED) display according to the present exemplary embodiment, the first inorganic layer 410, the first organic layer 420, the second inorganic layer 430, the second organic layer 440, the third inorganic layer 450, and the fourth inorganic layer 460' are sequentially deposited. Here, the first inorganic layer 410, the second inorganic layer 430, the third inorganic layer 450, and the fourth inorganic layer 460' may be, for example, a single layer or a laminated layer including a metal oxide or a metal nitride. For example, in an embodiment, the first inorganic layer 410, the second inorganic layer 430, the third inorganic layer 450, and the fourth inorganic layer 460' may include one selected from AlOx, TiOx, ZnO, SiOx, and SiNx. In addition, the first organic layer 420 and the second organic layer 440 may each be formed of, for example, a polymer. For example, in an embodiment, the first organic layer 420 and the second organic layer 440 may each be a single layer or a laminated layer formed of any one of polyethylene terephthalate, polyimide, polycarbonate, epoxy, polyethylene, and polyacrylate.

For the bending encapsulation layer 400P2' of the thin film encapsulation layer 400', the plurality of pores 1' are formed in the fourth inorganic layer 460'. At this time, the size of the pores 1' may be, for example, gradually decreased as a bending angle ($\theta$) of the bending encapsulation layer 400P2' is increased. When the size of the pores 1' is small, the refraction effect is, for example, large such that the efficiency and the luminance may be maximized by solving the reduction of the luminance according to the increasing of the bending angle (θ).

Meanwhile, in the organic light emitting diode (OLED) display of FIGS. 1 to 6, the plurality of pores are formed in the bending encapsulation layer positioned at two bending display parts of the organic light emitting diode (OLED) display, but exemplary embodiments of the present invention are not limited thereto. For example, alternatively in an exemplary embodiment, the forming of a plurality of pores in the bending encapsulation layer of the organic light emitting diode (OLED) display having three and more bending display parts is possible.

Next, referring to FIG. 8, an organic light emitting diode (OLED) display according to an exemplary embodiment will be described.

Figure 8:
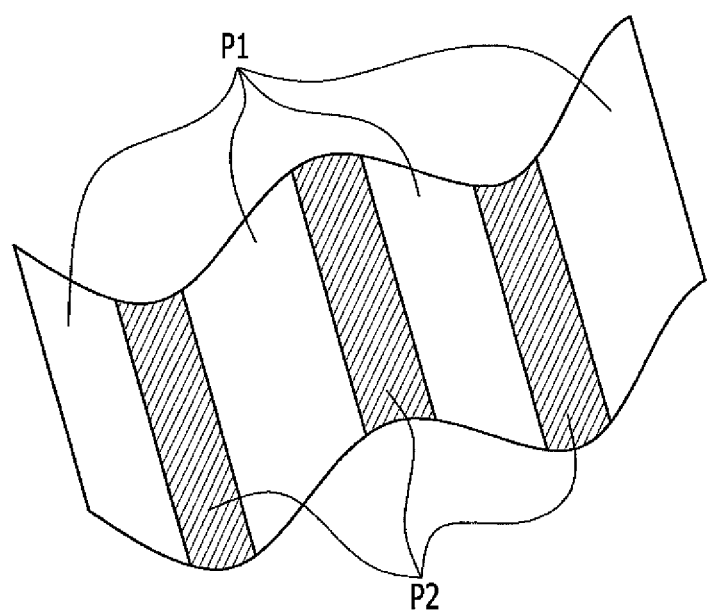
FIG. 8 is a perspective view of an organic light emitting diode (OLED) display according to an exemplary embodiment.

FIG. 8 is a perspective view of an organic light emitting diode (OLED) display according to an exemplary embodiment.

The present exemplary embodiment is substantially equivalent to the organic light emitting diode (OLED) shown in FIG. 1 to FIG. 6 except for a number of bending display parts such that the overlapping description is omitted.

As shown in FIG. 8, the organic light emitting diode (OLED) display according to the present exemplary embodiment includes, for example, at least one front display part P1 that is flat and at least one bending display part P2 that is bent at the end of the front display part P1. FIG. 8 shows an exemplary embodiment of the organic light emitting diode (OLED) display having four front display parts P1 and three bending display parts P2.

As shown in FIG. 8, by only forming a plurality of pores 1 in the bending encapsulation layer 400P2 positioned at three bending display parts P2, the luminance of the three bending display parts P2 may be increased such that the bending display part P2 may be easily recognized by the user.

Having described exemplary embodiments of the present invention, it is further noted that it is readily apparent to those of ordinary skill in the art that various modifications may be made without departing from the spirit and scope of the invention which is defined by the metes and bounds of the appended claims.

What is claimed is:

1. An organic light emitting diode (OLED) display comprising:
 a display layer including a front display layer configured to display an image at a front of the OLED display and a bending display layer bent at an end of the front display layer; and
 a thin film encapsulation layer covering the display layer,
 wherein the thin film encapsulation layer includes a front encapsulation layer disposed on the front display layer and a bending encapsulation layer disposed on the bending display layer and having a plurality of pores.

2. The OLED display of claim 1, wherein a size of the pores disposed in the bending encapsulation layer is in a range from about 10 Å to about 10,000 Å.

3. The OLED display of claim 2, wherein the size of the pores gradually decreases as a bending angle of the bending encapsulation layer increases.

4. The OLED display of claim 1, wherein the thin film encapsulation layer includes a plurality of deposited inorganic layers and organic layers.

5. The OLED display of claim 4, wherein the inorganic layer comprises at least one material selected from the group consisting of aluminum oxide (AlOx), titanium oxide (TiOx), zinc oxide (ZnO), silicon oxide (SiOx), and silicon nitride (SiNx).

6. The OLED display of claim 5, wherein the pores are disposed in at least one among the plurality of inorganic layers and organic layers.

7. An organic light emitting diode (OLED) display comprising:
 a display layer comprising a front display layer disposed at a front display part of the OLED display and configured to display an image at the front part of the OLED display and a bending display layer disposed at a bending display part of the OLED display and bent at an end of the front display layer,
 wherein the front display layer and the bending display layer of the display layer each include:
 a substrate,
 a thin film display layer including a plurality of thin film transistors (TFT's) and a storage capacitor and disposed on the substrate, and
 an organic light emitting diode disposed on the thin film display layer;
 a thin film encapsulation layer disposed on the organic light emitting diode of the display layer,
 wherein the thin film encapsulation layer includes a front encapsulation layer disposed on the front display layer and a bending encapsulation layer disposed on the bending display layer and having a plurality of pores, and
 wherein the front encapsulation layer and the bending encapsulation layer each include a plurality of inorganic layers and a plurality of organic layers.

8. The OLED display of claim 7, wherein the front encapsulation layer and the bending encapsulation layer of the thin film encapsulation layer each comprise a first inorganic layer disposed on the organic light emitting diode of the display layer, a first organic layer disposed on the first inorganic layer, a second inorganic layer disposed on the first organic layer, a second organic layer disposed on the second inorganic layer, a third inorganic layer disposed on the second organic layer and a fourth inorganic layer disposed on the third inorganic layer.

9. The OLED display of claim 8, wherein at least one of the first inorganic layer, the second inorganic layer, the third inorganic layer and the fourth inorganic layer comprises a material selected from the group consisting of aluminum oxide (AlOx), titanium oxide (TiOx), zinc oxide (ZnO), silicon oxide (SiOx), and silicon nitride (SiNx).

10. The OLED display of claim 8, wherein the pores are disposed in the fourth inorganic layer of the bending encapsulation layer.

11. The OLED display of claim 10, wherein a size of the pores disposed in the fourth inorganic layer of the bending encapsulation layer is a uniform size and in a range from about 10 Å to about 10,000 Å.

12. The OLED display of claim 10, wherein a size of the pores disposed in the fourth inorganic layer of the bending encapsulation layer is in a range from about 10 Å to about 10,000 Å and wherein the size of the pores gradually decreases as a bending angle of the bending encapsulation layer increases.

13. An organic light emitting diode (OLED) display comprising:
 a display layer comprising a front display layer disposed at a front display part of the OLED display and configured to display an image at the front display part of the OLED display and a bending display layer disposed at a bending display part of the OLED display and bent at an end of the front display layer, wherein the front display layer and the bending display layer of the display layer each include:

a substrate, a buffer layer disposed on the substrate, a gate insulating film disposed on the buffer layer, an interlayer insulating film disposed on the gate insulating film, a thin film switching transistor disposed on the buffer layer, the gate insulating film and the interlayer insulating film, a thin film driving transistor disposed on the buffer layer, the gate insulating film and the interlayer insulating film, wherein the thin film driving transistor and the thin film switching transistor are spaced apart from each other, a storage capacitor disposed on the interlayer insulating film and the gate insulating film, a protective film disposed on the thin film switching transistor, the thin film driving transistor and the storage capacitor, a pixel electrode disposed on the protective film of the display layer, a pixel defining layer disposed on portions of the pixel electrode and the protective film and including an opening exposing the pixel electrode, an organic emission layer disposed in the opening of the pixel defining layer, and a common electrode disposed on the pixel defining layer and the organic emission layer, wherein the pixel electrode, the organic emission layer and the common electrode constitute an organic light emitting diode; and a thin film encapsulation layer disposed on the organic light emitting diode of the display layer, wherein the thin film encapsulation layer includes a front encapsulation layer disposed on the front display layer and a bending encapsulation layer disposed on the bending display layer and having a plurality of pores, and wherein the front encapsulation layer and the bending encapsulation layer each include a plurality of inorganic layers and a plurality of organic layers.

14. The OLED display of claim 13, wherein the thin film switching transistor includes a switching semiconductor layer disposed on the buffer layer and including a channel region and a source region and a drain region disposed at respective sides of the channel region, a switching source electrode and a switching drain electrode electrically connected to the source region and the drain region, respectively of the switching semiconductor layer through a first source contact hole and a first drain contact hole in the interlayer insulating film and the gate insulating film and a switching gate electrode disposed on the gate insulating film, and wherein the thin film driving transistor includes a driving semiconductor layer disposed on the buffer layer and including a channel region and a source region and a drain region disposed at respective sides of the channel region, a driving source electrode and a driving drain electrode electrically connected to the source region and the drain region, respectively of the driving semiconductor layer through a second source contact hole and a second drain contact hole in the interlayer insulating film and the gate insulating film and a driving gate electrode disposed on the gate insulating film.

15. The OLED display of claim 14, further comprising a storage capacitor comprising a first storage capacitor plate disposed on the gate insulating film and a second storage capacitor plate disposed on an upper surface of the interlayer insulating film and overlapping with the first storage capacitor plate, wherein the switching drain electrode is electrically connected to the first storage capacitor plate and the driving gate electrode through a storage contact hole in the interlayer insulating film.

16. The OLED display of claim 13, wherein the front encapsulation layer and the bending encapsulation layer of the thin film encapsulation layer each comprise a first inorganic layer disposed on the organic light emitting diode of the display layer, a first organic layer disposed on the first inorganic layer, a second inorganic layer disposed on the first organic layer, a second organic layer disposed on the second inorganic layer, a third inorganic layer disposed on the second organic layer and a fourth inorganic layer disposed on the third inorganic layer.

17. The OLED display of claim 16, wherein at least one of the first inorganic layer, the second inorganic layer, the third inorganic layer and the fourth inorganic layer comprises a material selected from the group consisting of aluminum oxide (AlOx), titanium oxide (TiOx), zinc oxide (ZnO), silicon oxide (SiOx), and silicon nitride (SiNx).

18. The OLED display of claim 16, wherein the pores are disposed in the fourth inorganic layer of the bending encapsulation layer.

19. The OLED display of claim 18, wherein a size of the pores disposed in the fourth inorganic layer of the bending encapsulation layer is a uniform size and is in a range from about 10 Å to about 10,000 Å.

20. The OLED display of claim 18, wherein a size of the pores disposed in the fourth inorganic layer of the bending encapsulation layer is in a range from about 10 Å to about 10,000 Å and wherein the size of the pores gradually decreases as a bending angle of the bending encapsulation layer increases.

* * * * *